(12) United States Patent
Asako

(10) Patent No.: US 9,714,845 B2
(45) Date of Patent: Jul. 25, 2017

(54) RESOLVER ABNORMALITY DETECTION APPARATUS

(71) Applicant: DENSO CORPORATION, Kariya, Aichi-pref. (JP)

(72) Inventor: Yosuke Asako, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/050,949

(22) Filed: Feb. 23, 2016

(65) Prior Publication Data

US 2016/0245869 A1 Aug. 25, 2016

(30) Foreign Application Priority Data

Feb. 23, 2015 (JP) ................................. 2015-032673

(51) Int. Cl.
| | |
|---|---|
| *G01R 31/06* | (2006.01) |
| *G01D 5/20* | (2006.01) |
| *G01D 5/244* | (2006.01) |
| *G01R 31/34* | (2006.01) |
| *G01D 18/00* | (2006.01) |
| *G01R 31/02* | (2006.01) |

(52) U.S. Cl.
CPC ....... *G01D 5/2073* (2013.01); *G01D 5/24457* (2013.01); *G01D 18/00* (2013.01); *G01R 31/025* (2013.01); *G01R 31/343* (2013.01)

(58) Field of Classification Search
CPC combination set(s) only.
See application file for complete search history.

(56) References Cited

U.S. PATENT DOCUMENTS

2013/0088241 A1* 4/2013 Asako ................. G01R 31/343
324/546

FOREIGN PATENT DOCUMENTS

JP 2000-166205 A 6/2000

* cited by examiner

*Primary Examiner* — Minh Phan
(74) *Attorney, Agent, or Firm* — Oliff PLC

(57) ABSTRACT

A resolver abnormality detection apparatus for a resolver having first and second secondary windings includes a first resistor section including a first pull-up resistor for pulling up the first secondary winding, a first pull-down resistor for pulling down the first secondary winding, a second resistor section including a second pull-up resistor for pulling up the second secondary winding and a second pull-down resistor for pulling down the second secondary winding, and first and second differential input sections connected across the first secondary winding and across the second secondary winding, respectively. The resolver abnormality detection apparatus detects presence of an abnormality in each of the first and second secondary windings based on outputs of the first and second differential input sections, a DC voltage between the first resistor section and the first differential input section and a DC voltage between the second resistor section and the second differential input section.

5 Claims, 1 Drawing Sheet

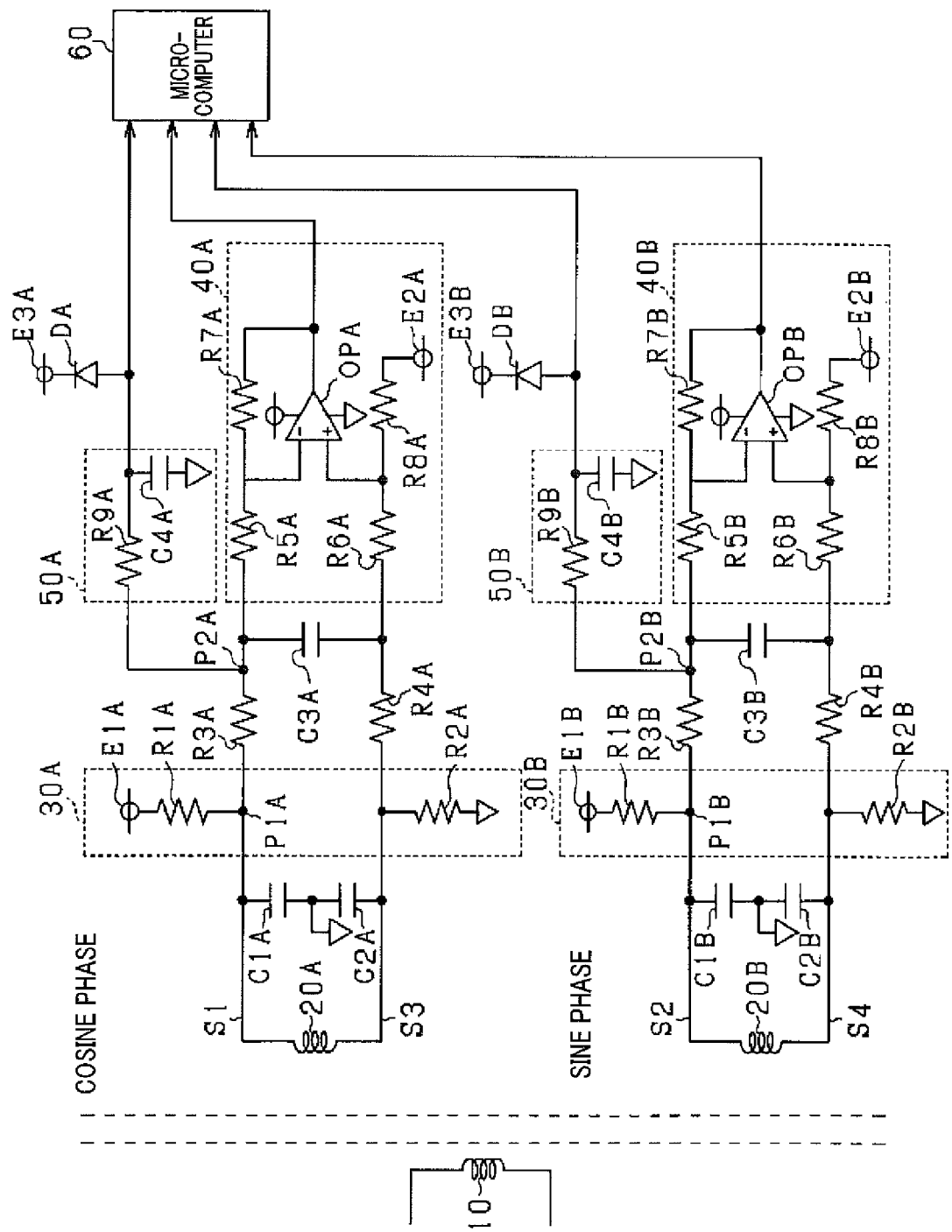

RESOLVER ABNORMALITY DETECTION APPARATUS

This application claims priority to Japanese Patent Application No. 2015-32673 filed on Feb. 23, 2015, the entire contents of which are hereby incorporated by reference.

BACKGROUND OF THE INVENTION

1. Field of the Invention

The present invention relates to a resolver abnormality detection apparatus for detecting an abnormality such as a wire breakage or a sky fault (a short circuit to power supply) in a resolver.

2. Description of Related Art

Japanese Patent Application Laid-open No. 2000-166205 describes an interphase short-circuit detection apparatus for a resolver, the apparatus including a DC power supply connected to the cosine phase of the secondary winding of the resolver, a comparator for comparing a DC voltage relative to ground of the sine phase of the secondary winding of the resolver with a threshold value, and a comparator for comparing a DC voltage relative to ground of the cosine phase of the secondary winding of the resolver with a threshold value. This interphase short-circuit detection apparatus can detect an interphase short circuit in the secondary winding, and a short circuit between the primary winding and the secondary winding based on the outputs of the two comparators.

This interphase short-circuit detection apparatus can detect also a sky fault and a ground fault (a short circuit to ground) in the secondary winding. However, in this interphase short-circuit detection apparatus, there is a limit to the rotational angle θ of the rotor of a resolver in detecting a wire breakage in the secondary winding. For example, in a case where a wire breakage is determined to be present in the resolver when the equation of $\sin(\theta)^2 + \cos(\theta)^2 = 1$ does not hold, if there occurs a wire breakage in the sine phase when the rotational angle θ of the rotor is 0 degrees, it cannot be detected, because this equation still holds. Accordingly, this interphase short-circuit detection apparatus has a problem in that when a wire breakage occurs while the rotor is stationary at a specific angle position, the wire breakage may not be detected.

SUMMARY

An exemplary embodiment provides a resolver abnormality detection apparatus for a resolver having a first secondary winding and a second secondary winding which constitute different phases, resolver abnormality detection apparatus including:

a first resistor section including a first pull-up resistor for pulling up the first secondary winding, a first pull-down resistor for pulling down the first secondary winding and a first DC power supply connected to the first pull-up resistor;

a second resistor section including a second pull-up resistor for pulling up the second secondary winding, a second pull-down resistor for pulling down the second secondary winding and a second DC power supply connected to the second pull-up resistor;

a first differential input section connected across the first secondary winding; and a second differential input section connected across the second secondary winding;

the resolver abnormality detection apparatus detecting presence of an abnormality in each of the first and second secondary windings based on outputs of the first and second differential input sections, a first voltage as a DC voltage between the first resistor section and the first differential input section and a second voltage as a DC voltage between the second resistor section and the second differential input section.

According to the exemplary embodiment, there is provided a resolver abnormality detection apparatus capable of detecting a wire breakage, a sky-fault and a ground-fault without limitation of the angular position of the resolver.

Other advantages and features of the invention will become apparent from the following description including the drawings and claims.

BRIEF DESCRIPTION OF THE DRAWINGS

In the accompanying drawings:

FIG. 1 is a diagram showing the structure of a resolver abnormality detection apparatus according to an embodiment of the invention.

PREFERRED EMBODIMENTS OF THE INVENTION

A resolver abnormality detection apparatus for a resolver according to an embodiment of the invention is described with reference to FIG. 1.

In this embodiment, the resolver includes a primary winding 10, a secondary winding 20A (a first secondary winding) and a secondary winding 20B (a second secondary winding). The primary winding 10, the secondary winding 20A and the secondary winding 20B are insulated from one another. The primary winding 10 is connected with an excitation circuit (not shown) for supplying an excitation signal to the primary winding 10. The secondary winding 20A constitutes a cosine phase. The secondary winding 20B constitutes a sine phase.

The primary winding 10 is mechanically coupled to the rotor of a motor. Each of the mutual inductance between the secondary winding 20A and the primary winding 10 and the mutual inductance between the secondary winding 20B and the primary winding changes depending on the rotational angle θ of the rotor of the motor. Accordingly, the output voltage of the secondary winding 20A becomes a modulated wave signal equivalent to the excitation signal modulated with a modulating wave signal cos θ, and the output voltage of the secondary winding 20B becomes a modulated wave signal equivalent to the excitation signal modulated with a modulating wave signal sin θ.

Next, the structure of the cosine phase of the resolver abnormality detection apparatus is explained. A Y-capacitor for removing common mode noise is connected across the secondary winding 20A. The Y-capacitor is constituted of capacitors C1A and C2A. The capacitor C1A is connected to a signal line S1 of the secondary winding 20A. The capacitor 2A is connected to a signal line S3 of the secondary winding 20A.

Further, a resistor section 30A (a first resistor section) is connected to the secondary winding 20A on the more output side than the capacitors C1A and C2A. The resistor section 30A includes a pull-up resistor R1A (a first pull-up resistor), a pull-down resistor R2A (a first pull down resistor), and a pull-up power supply E1A (a first DC power supply). The pull-up power supply E1A, which is a DC power supply of a voltage VPA, is connected to a first end of the pull-up resistor R1A. A second end of the pull-up resistor R1A is connected to the signal line S1 of the secondary winding

20A. The pull-up resistor R1A is for pulling up the signal line S1 of the secondary winding 20A to the voltage of the pull-up power supply E1A. A first end of the pull down resistor R2A is grounded. A second end of the pull-down resistor R2A is connected to the signal line S3 of the secondary winding 20A. The pull-down resistor R2A is for pulling down the signal line S3 of the secondary winding 20A to a ground voltage.

The resistance of the pull-up resistor R1A is set to the same value as the pull-down resistor R2A. The resistance of the pull-up resistor R1A and the pull-down resistor R2A is sufficiently larger than the DC resistance of the secondary winding 20A. Accordingly, since the DC component of the voltage between the signal lines S1 and 53 can be regarded to be zero, the DC voltage at a connection node P1A between the signal line S1 and the pull-up resistor R1A is VPA/2. That is, the signal line S1 and the signal line S3 are equal to each other in DC voltage.

The second end of the pull-up resistor R1A is connected with a first end of a resistor R3A for gain adjustment. The second end of the pull-up resistor R2A is connected with a first end of a resistor R4A for gain adjustment. Between second ends of the resistor R3A and R4A, a capacitor C3A for removing normal mode noise is connected. The resistances of the resistance R3A and the resistance R4A are set equal to each other.

The capacitor 3A is connected to a differential input section 40A (a first differential input section) at is both ends. The differential input section 40A includes resistors R5A to R8A, a DC power supply E2A of a voltage of Vc and a differential amplifier OPA. The resistors R5A and R7A are series-connected to the terminal on the side of the signal line S1 of the capacitor C3A. The resistors R6A and R8A are series-connected to the terminal on the side of the signal line S3 of the capacitor C3A. The connection node between the resistor R5A and the resistor R7A is connected to the inverting input of the differential amplifier OPA. The connection node between the resistor R6A and the resistor R8A is connected to the non-inverting input of the differential amplifier OPA. The resistor R7A is connected to the output terminal of the differential amplifier OPA. The resistor R8A is connected to the DC power supply E2A. The resistance of the resistor R5A is set equal to that of the resistor R6A. The resistance of the resistor R7A is set equal to that of the resistor R8A.

Here, it is assumed that the voltage at the connection node between resistor R5A and capacitor C3A, that is, the input voltage of differential input section 40A on the side of the signal line S1 is Vi1, and the voltage at the connection node between the resistor R6A and the capacitor C3A, that is, the input voltage of differential input section 40A on the side of the signal line S3 is Vi3. In this assumption, the output voltage VOA of the differential amplifier OPA is equal to Vc+R7A/R5A(Vi3−Vi1).

Between the resistor R3A and the capacitor C3A, a filter 50A is connected. The filter 50A, which is a low-pass filter for removing AC components, is constituted of a resistor R9A and a capacitor C4A.

Next, the structure of the sine phase of the resolver abnormality detection apparatus is explained. The structure of the sine phase is similar to that of the cosine phase described above. Signal lines S2 and S4 of the secondary winding 20B correspond to the signal lines S1 and S3, respectively. Capacitors C1B and C2B correspond to the capacitors C1A and C2A, respectively. A resistor section 30B (a second resistor section) including a pull-up resistor R1B (a second pull-up resistor), a pull-down resistor R2B (a second pull-down resistor) and a pull-up power supply E1B (a second DC power supply) corresponds to the resistor section 30A. A difference input section 40B (a second difference input section) corresponds to the difference input section 40A. A filter 50B corresponds to the filter 50A. A resistor R3B, a resistor R4B and a capacitor C3B correspond to the resistor R3A, the resistor R4A and the capacitor C3A, respectively.

The respective components and power supplies of the sine phase are the same in value as those of the cosine phase except for the voltage of the pull-up power supply E1B. The voltage of the pull-up power supply E1B is a DC voltage of VPB which is different from the voltage of VPA. Accordingly, the DC voltage of VPB/2 at the connection node P1B between the signal line S2 and the pull-up resistor R1B differs from the DC voltage VPA/2 at the connection node P1A. Accordingly, when the resolver is normal, the DC voltage at the connection node P2A between the resistor R3A and the filter 50A is different in value from the DC voltage at the connection node P2B between the resistor R3B and the filter 50B. That is, the DC voltage outputted from the filter 50A is different in value from the DC voltage outputted from the filter 50B. Here, the resolver is assumed to be normal if there is no abnormality such as a wire breakage, a short circuit, a sky fault (that is, a short circuit to the battery positive terminal), a ground fault or an interphase short-circuit in the primary winding 10 or secondary windings 20A and 20B.

The output voltage VMA (a first voltage) of the filter 50A of the cosine phase and the output voltage VMB (a second voltage) of the filter 50B of the sine phase are inputted to the microcomputer 60. The output voltage of the differential input section 40A of the cosine phase and the output voltage of the differential input section 40B of the sine phase are also inputted to a microcomputer 60.

An A/D converter included in the microcomputer 60 converts the voltages VMA and VWB outputted from the filters 50A and 50B, and the voltages VOA and VOB outputted from the differential input sections 40A and 40B into digital values. The microcomputer 60 detects an abnormality in the secondary windings 20A and 20B based on the voltages VMA and VWB and the voltages VOA and VOB having been converted into the digital values. Specifically, the microcomputer 60 detects a wire breakage, a short circuit, a sky fault, a ground fault or an interphase short-circuit in the secondary windings 20A and 20B. The output terminal of the filter 50A is connected with a diode DA and a power supply E3A. The output terminal of the filter 50B is connected with a diode DB and a power supply E3B. The diodes DA and DB and the power supplies E3A and E3B are for reducing each of the input voltages of the microcomputer 60 below a predetermined value when a sky fault occurs in the secondary winding 20A or 20B to protect the microcomputer 60.

The resolver abnormality detection apparatus of this embodiment is constituted of the resistors 30A and 30B, the differential input sections 40A and 40B, the filters 50A and 50B, and the microcomputer 60. Next, the operation of the resolver abnormality detection apparatus is explained.

For a case where a wire breakage occurs in the signal line S1 or S3:

If there is no wire breakage, since the signal line S1 and the signal line 83 are at the same DC voltage, the DC component of the output voltage VOA of the differential input section 40A is equal to Vc. That is, the output voltage VOA the differential input section 40A is at the voltage Vc superimposed with an AC component. The AC component is equivalent to the change with time of the envelope of the modulated wave signal of the cosine phase.

When there is a wire breakage in the signal line S1 or S3, specifically, when the secondary winding 20A is broken on the more input side than the resistor section 30A is, the DC component of the voltage inputted to the differential input section 40A becomes equal to the voltage VPA of the pull-up power supply E1A on the side of the signal line S1, and becomes equal to the ground voltage on the side of the signal line S3. Accordingly, the DC component of the output voltage VOA offsets to the ground side compared to when there is no wire breakage.

Accordingly, the microcomputer 60 detects a presence of a wire breakage in the signal line S1 or S3 when the DC component of the output voltage VOA has decreased below a threshold value. When a wire breakage occurs in the signal line S1 or S3, since the DC component of the output voltage VOA always becomes lower than the threshold value regardless of the rotational angle of the rotor, the wire breakage can be detected reliably without limitation of the rotational angle of the rotor. The microcomputer 60 can detect a wire breakage also in the signal line S2 or S4 in a similar way to the above.

For a case where a short circuit occurs between the signal line S1 and the signal line S3:

In this case, both the DC component and the AC component of the voltage between the signal lines S1 and S3 become zero. Accordingly, the output voltage VOA becomes equal to the voltage Vc of the DC power supply E2A. The microcomputer 60 detects a presence of an interphase short-circuit between the signal lines S1 and S3 by comparing the output voltage VOA with an upper threshold value and a lower threshold value. The upper threshold value is larger than the voltage Vc, and the lower threshold value is smaller than the voltage Vc. The upper and lower threshold values are set such that one of the output voltage VOA of the differential input section 40A and the output voltage VOB of the differential input section 40B is always larger than the upper threshold value, or always smaller than the lower threshold value as long as both the cosine phase and the sine phase are normal.

Accordingly, if a short circuit occurs between the signal lines S1 and S3 the microcomputer 60 detects a presence of the short circuit when the output voltage VOB of the cosine phase is detected to be between the upper threshold value and the lower threshold value. The microcomputer 60 can detect a short circuit also between the signal lines S2 and S4 in the similar way to the above.

For a case where a sky fault occurs in the signal line S1 or S3:

If a short circuit occurs between the positive terminal of a DC power supply such as a battery and the signal line S1 or S3, that is, if a sky fault occurs in the signal line S1 or S3, the DC voltage of the DC power supply is applied to the signal lines S1 and S3. Accordingly, the DC voltage at the connection node P2A, that is, the output voltage VMA of the filter 50A when both the signal lines S1 and S3 are normal is set lower than the DC voltage assumed to be applied to the signal lines S1 and S3 when a sky fault has occurred. In this setting, when a sky fault occurs in the signal line S1 or S3, the DC voltage at the connection node P2A and the output voltage VMA of the filter 50A increase from their normal values, respectively. Accordingly, the microcomputer 60 detects a presence of the sky fault in the signal line S1 or S3 when the output voltage of the filter 50A exceeds a sky-fault threshold. The sky-fault threshold value is larger than the normal value of the output voltage VMA. The microcomputer 60 can detect a presence of a sky fault also in the signal line S2 or 54 in the similar way to the above.

For a case where a ground fault occurs in the signal line S1 or S3:

When the signal line S1 or S3 is short-circuited to the ground, that is, when a sky fault has occurred in the signal line S1 or S3, the ground voltage is applied to the signal lines S1 and S3. Accordingly, the DC voltage at the connection node P2A, that is, the output voltage VMA of the filter 50A when both the signal lines S1 and S3 are normal is set larger than the ground voltage. In this setting, when a sky fault has occurred in the signal line S1 or S3, the DC voltage at the connection node P2A and the output voltage VMA of the filter 50A decrease from their normal values, respectively. Accordingly, the microcomputer 60 detects the presence of the ground fault in the signal line S1 or S3 when the output voltage VMA of the filter 50A decreases below a ground-fault threshold value. The ground-fault threshold value is set smaller than the normal value of the output voltage VMA. The microcomputer 60 can detect a presence of a ground fault also in the signal line S2 or S4 in the similar way to the above.

For a case where an interphase short-circuit occurs:

In this embodiment, the voltage VPA of the pull-up power supply E1A, and voltage VPB of the pull-up power supply E1B are set different from each other, so that the DC voltage at the connection node P2A is different from the voltage at the connection node P2B when both secondary windings 20A and 20B are normal. Accordingly, if the signal line S3 of the cosine phase and the signal line 92 of the sine phase are short-circuited to each other, causing an interphase short-circuit between the cosine phase and the sine phase, the output voltage VMB of the filter 50B changes. For example, when the DC voltage at the connection node P2A is larger than the DC voltage at the connection node P2B, the output voltage VMB increases from its normal value when an interphase short-circuit has occurred. However, since the DC voltage at the connection node P2A is smaller than the voltage applied to the sine phase when a sky fault has occurred, the output voltage VBM does not increase so much when an interphase short-circuit has occurred compared to when a sky fault has occurred. On the other hand, when the DC voltage at the connection node P2A is smaller than the DC voltage at the connection node P2B, the output voltage VMB decreases from its normal value when an interphase short-circuit has occurred. However, the output voltage VBM does not decrease so much compared to when a ground fault has occurred.

Accordingly, the microcomputer 60 detects a presence of the interphase short-circuit when the output voltage VBM exceeds an interphase short-circuit threshold value if the DC voltage at the connection node P2A is larger than the DC voltage at the connection node P2B. The interphase short-circuit threshold value is set larger than the normal value of the output voltage VBM and smaller than the sky fault threshold value. Further, the microcomputer 60 detects a presence of the interphase short-circuit when the output voltage VBM falls below an interphase short-circuit threshold value if the DC voltage at the connection node P2A is smaller than the DC voltage at the connection node P2B. The interphase short-circuit threshold value is set smaller than the normal value of the output voltage VBM, and larger than the ground-fault threshold value.

The resolver abnormality detection apparatus according to the embodiment described above provides the following advantages.

It is possible to detect a wire breakage, a sky fault or a ground fault in the secondary winding 20A or 20B without limitation of the rotational angle of the rotor by monitoring the output voltages VOA and VOB of the differential input sections 40A and 40B, and the output voltage VMA and VMB of the filters 50A and 50B.

Since the voltage VPA of the pull-up power supply E1A and the voltage VPB of the pull-up power supply E1B are set to different values from each other, the DC voltage at the connection node P2A and the DC voltage at the connection node P2B when both the secondary windings 20A and 20B are normal can be made different from each other. Accordingly, it is possible to detect an interphase short-circuit between the secondary windings 20A and 20B based on the output voltage VMB of the filter 50B.

Since the normal values of the output voltages VMA and VMB are set between the DC voltage applied to the secondary winding 20A when a sky failure has occurred and the ground voltage and between the DC voltage applied to the secondary winding 20B when a sky failure has occurred and the ground voltage, respectively, it is possible to detect a sky fault and a ground fault in each of the secondary windings 20A and 20B based on the output voltages VMA and VMB.

Since the filter 50A is connected between the resistor section 30A and the differential input section 40A, and the filter 50B is connected between the resistor section 30B and the differential input section 40B, it is possible to extract the output voltages VMA and VMB as DC components to be supplied to the microcomputer 60.

Other Embodiments

It is possible that the voltage VPA of the pull-up power supply E1A and voltage VPB of the pull-up power supply E1B are set equal to each other, and the resistances of the pull-up resistor and the pull-down resistor are set different from each other at least at one of the cosine phase and the sine phase. Also in this setting, the output voltage VMA of the filter 50A and the output voltage VMB of filter 50B can be made different from each other when both the secondary windings 20A and 20B are normal.

For example, if the resistance of the pull-down resistor R2A is set to twice that of the pull-up resistor R1A, the DC voltage at the connection node P1A becomes VPA×2/3. On the other hand, if the resistance of the pull-down resistor R2B and the resistance of the pull-up resistor R1B are set equal to each other, the DC voltage at the connection node P1B becomes VPB/2. Accordingly, the output voltage VMA of the filter 50A and output voltage VMB of the filter 50B can be made different from each other although the voltage VPA and the voltage VPB are equal to each other.

Further, the resistance of the pull-up resistor R1B and the resistance of the pull-down resistor R2B may be set different from each other. For example, if the resistance of the pull-up resistor R1B is set to twice that of the pull-down resistor R2B, the DC voltage at the connection node P1B becomes VPB×1/3. Accordingly, the output voltage VMA of the filter 50A and output voltage VMB of the filter 50B can be made different from each other although the voltage VPA and the voltage VPB are equal to each other.

Further, it is possible that the voltage VPA of the pull-up power supply E1A and the voltage VPB of the pull-up power supply E1B are set equal to each other, and the resistance of the pull-up resistor and the resistance of the pull-down resistor are set different from each other. In this case, the voltages VPA and VPB of the pull-up power supplies E1A and E1B, and the resistances of the pull-up resistors R1A and R1B and the pull-down resistors R2A and R2B are set such that the output voltage VMA of the filter 50A and output voltage VMB of the filter 50B are different from each other when both the secondary windings 20A and 20B are normal.

A comparator may be used instead of the microcomputer 60. In this case, the comparator compares the output voltages VOA and VOB of the differential input sections 40A and 40B with their thresholds, and compares the output voltages VMA and VMB of the filters 50A and 50B with their thresholds to detect an abnormality in the secondary winding 20A or 20B.

In a case where it is not necessary to detect any interphase short-circuit between the secondary winding 20A and the secondary winding 20B, the output voltage VMA of the filter 50A and the output voltage VMB of the filter 50B may be set to the same value. That is, in this case, it is possible that the voltages VPA and VPB of the pull-up power supplies E1A and E1B are set to the same value, the resistances of the pull-up resistor R1A and the pull-down resistor R2A are set to the same value, and the resistances of the pull-up resistor R1B and the pull-down resistor R2B are set to the same value.

The filter 50A may be connected between the resistor R4A and the capacitor C3A instead of between the resistor R3A and the capacitor C3A. The filter 50B may be connected between the resistor R4B and the capacitor C3B instead of between the resistor R3B and the capacitor C3B.

The resistor R3A and the resistor R4A may be connected between the capacitor C3A and the differential input section 40A. In this case, the filter 50A is connected between the pull-up resistor R1A and the capacitor C3A or between the pull-down resistor R2A and the capacitor C3A. The resistor R3B and the resistor R4B may be connected between the capacitor C3B and the differential input section 40B. In this case, the filter 50B is connected between the pull-up resistor R1B and the capacitor C3B or between the pull-down resistor R2B and the capacitor C3B.

The above explained preferred embodiments are exemplary of the invention of the present application which is described solely by the claims appended below. It should be understood that modifications of the preferred embodiments may be made as would occur to one of skill in the art.

What is claimed is:

1. A resolver abnormality detection apparatus for a resolver having a first secondary winding and a second secondary winding which constitute different phases, comprising:
    a first resistor section including a first pull-up resistor for pulling up the first secondary winding, a first pull-down resistor for pulling down the first secondary winding and a first DC power supply connected to the first pull-up resistor;
    a second resistor section including a second pull-up resistor for pulling up the second secondary winding, a second pull-down resistor for pulling down the second secondary winding and a second DC power supply connected to the second pull-up resistor;
    a first differential input section connected across the first secondary winding; and
    a second differential input section connected across the second secondary winding;
    the resolver abnormality detection apparatus detecting presence of an abnormality in each of the first and second secondary windings based on outputs of the first and second differential input sections, a first voltage as a DC voltage between the first resistor section and the first differential input section and a second voltage as a DC voltage between the second resistor section and the second differential input section.

2. The resolver abnormality detection apparatus according to claim 1, wherein an output voltage of the first DC power supply and an output voltage of the second DC power supply are set different in value from each other, the first voltage and the second voltage being different in value from each other when the resolver is normal.

3. The resolver abnormality detection apparatus according to claim 1, wherein there is a difference in resistance in at least one of between the first pull-up resistor and the first pull-down resistor and between the second pull-up resistor and the second pull-down resistor, the first voltage and the second voltage being different in value from each other when the resolver is normal.

4. The resolver abnormality detection apparatus according to claim 1, wherein the first voltage is set between a DC voltage assumed to be applied to the first secondary winding when a sky fault has occurred in the first secondary winding and a ground voltage, and the second voltage is set between a DC voltage assumed to be applied to the second secondary winding when a sky fault has occurred in the second secondary winding and the ground voltage.

5. The resolver abnormality detection apparatus according to claim 1, wherein a first filter for removing AC component is connected between the first resistor section and the first differential input section, and a second filter for removing AC component is connected between the second resistor section and the second differential input section, the first voltage being an output voltage of the first filter, and the second voltage being an output voltage of the second filter.

* * * * *